United States Patent
Hung et al.

(10) Patent No.: US 10,854,624 B2
(45) Date of Patent: Dec. 1, 2020

(54) SEMICONDUCTOR MEMORY DEVICE AND METHOD OF MANUFACTURING THE SAME

(71) Applicant: Winbond Electronics Corp., Taichung (TW)

(72) Inventors: Wen Hung, Taichung (TW); Yu-Kai Liao, Taichung (TW); Chiang-Hung Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/358,708

(22) Filed: Mar. 20, 2019

(65) Prior Publication Data

US 2020/0303394 A1 Sep. 24, 2020

(51) Int. Cl.
| | |
|---|---|
| *H01L 27/11548* | (2017.01) |
| *H01L 27/11573* | (2017.01) |
| *H01L 27/11526* | (2017.01) |
| *H01L 21/033* | (2006.01) |
| *H01L 21/311* | (2006.01) |
| *H01L 21/28* | (2006.01) |

(52) U.S. Cl.
CPC .... *H01L 27/11573* (2013.01); *H01L 21/0337* (2013.01); *H01L 21/31144* (2013.01); *H01L 27/11526* (2013.01); *H01L 29/40117* (2019.08)

(58) Field of Classification Search
CPC ......... H01L 27/11548; H01L 27/11575; H01L 21/762
See application file for complete search history.

(56) References Cited

U.S. PATENT DOCUMENTS 10,535,671 B2 * 1/2020 Liu ................... H01L 21/762
2007/0069304 A1 3/2007 Aida et al.

FOREIGN PATENT DOCUMENTS

TW 201535747 9/2015
TW 201614766 4/2016

OTHER PUBLICATIONS

"Office Action of Taiwan Counterpart Application", dated May 29, 2020, p. 1-p. 4.
"Office Action of Taiwan Counterpart Application", dated Jul. 24, 2020, p. 1-p. 4.

* cited by examiner

*Primary Examiner* — Mark V Prenty
(74) *Attorney, Agent, or Firm* — JCIPRNET

(57) ABSTRACT

Provided is a semiconductor memory device including a substrate, an isolation structure, a first gate dielectric layer, a first conductive layer, a second gate dielectric layer, a second conductive layer, and a protective layer. The substrate has an array region and a periphery region. The isolation structure is disposed in the substrate between the array and periphery regions. The first gate dielectric layer is disposed on the substrate in the array region. The first conductive layer is disposed on the first gate dielectric layer. The second gate dielectric layer is disposed on the substrate in the periphery region. The second conductive layer is disposed on the second dielectric layer. The second conductive layer extends to cover a portion of a top surface of the isolation structure. The protective layer is disposed between the second conductive layer and the isolation structure.

6 Claims, 6 Drawing Sheets

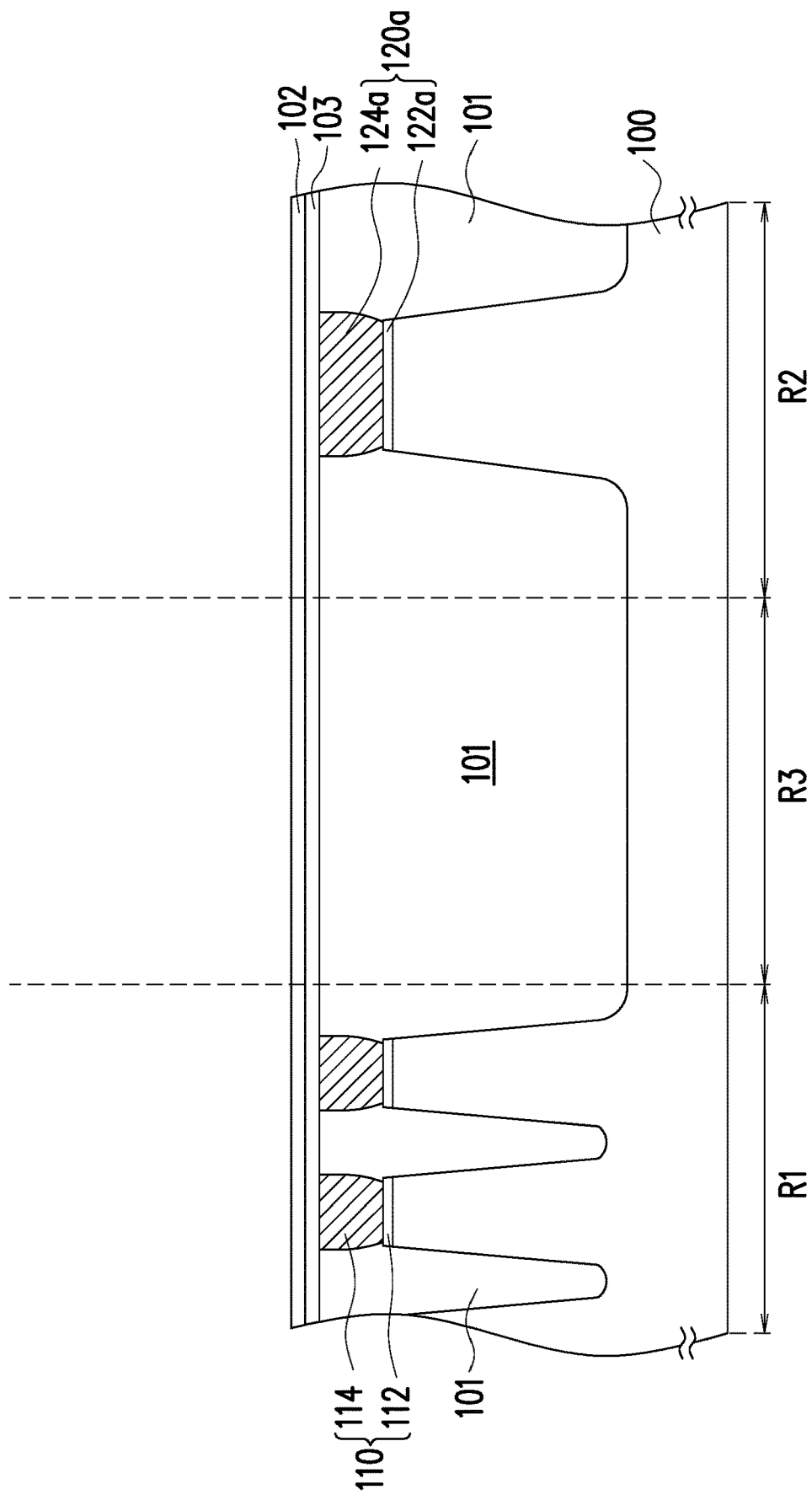

SEMICONDUCTOR MEMORY DEVICE AND METHOD OF MANUFACTURING THE SAME

BACKGROUND

Technical Field

The present invention relates to an integrated circuit and a method of manufacturing the same, and more particularly to a semiconductor memory device and a method of manufacturing the same.

Description of Related Art

With the rapid development of technology, it has become a trend to integrate devices in a cell array region and a peripheral region into a same chip, in order to achieve demands of reducing the cost and simplifying the process steps of semiconductor devices.

In conventional processes, different gate structures in the cell array region and the peripheral region need to be defined by using different photomasks. However, the isolation structure between the cell array region and the peripheral region would undergo multiple etching processes, thereby resulting in excessive loss of the isolation structure. In the case, the conductive layer on the isolation structure in the peripheral region near the boundary region is also consumed, so as to result in the generation of the polysilicon residue defects, thereby reducing the reliability and yield of the device. Therefore, it is an important issue to find out how to provide a semiconductor memory device and a method of manufacturing the same capable of reducing the polysilicon residue defects, thereby improving the reliability and yield of the semiconductor memory device.

SUMMARY

The invention provides a semiconductor memory device and a method of manufacturing the same capable of avoiding the generation of polysilicon residue defects, thereby improving the reliability and yield of the semiconductor memory device.

The present invention provides a semiconductor memory device including: a substrate, an isolation structure, a gate dielectric layer, a conductive layer, and a protective structure. The substrate has an array region and a peripheral region. The isolation structure is disposed in the substrate between the array region and the peripheral region. The gate dielectric layer is disposed on the substrate in the peripheral region. The conductive layer is disposed on the gate dielectric layer, wherein the conductive layer extends to cover a portion of a top surface of the isolation structure. The protective structure is disposed between the conductive layer and the isolation structure.

The invention provides a method of manufacturing a semiconductor memory device including following steps. A substrate having an array region and a peripheral region is provided. An isolation structure is formed in the substrate between the array region and the periphery region. A protective layer is blanketly formed on the substrate. A first mask layer is formed on the protective layer, wherein the first mask layer extends from the array region to cover a portion of the periphery region. A first portion of the protective layer is removed by using the first mask layer as an etching mask. A second mask layer is formed on the periphery region. A second portion of the protective layer is removed by using the second mask layer as an etching mask, so that a remaining protective layer is formed in an overlap region of the first mask layer and the second mask layer.

Based on the above, in the present invention, the first mask layer and the second mask layer are partially overlapped, so as to form a protective structure between the conductive layer and the isolation structure. The protective structure is able to prevent the underlying isolation structure from being excessively consumed during the etching process, so as to reduce the generation of polysilicon residue defects, thereby improving the reliability and yield of the semiconductor memory device.

In order to make the aforementioned features and advantages of the disclosure more comprehensible, embodiments accompanied with figures are described in detail below.

BRIEF DESCRIPTION OF THE DRAWINGS

FIG. 1A to FIG. 1F are cross-sectional views showing a manufacturing process of a semiconductor memory device in accordance with an embodiment of the present invention.

DESCRIPTION OF THE EMBODIMENTS

Figure 1B:
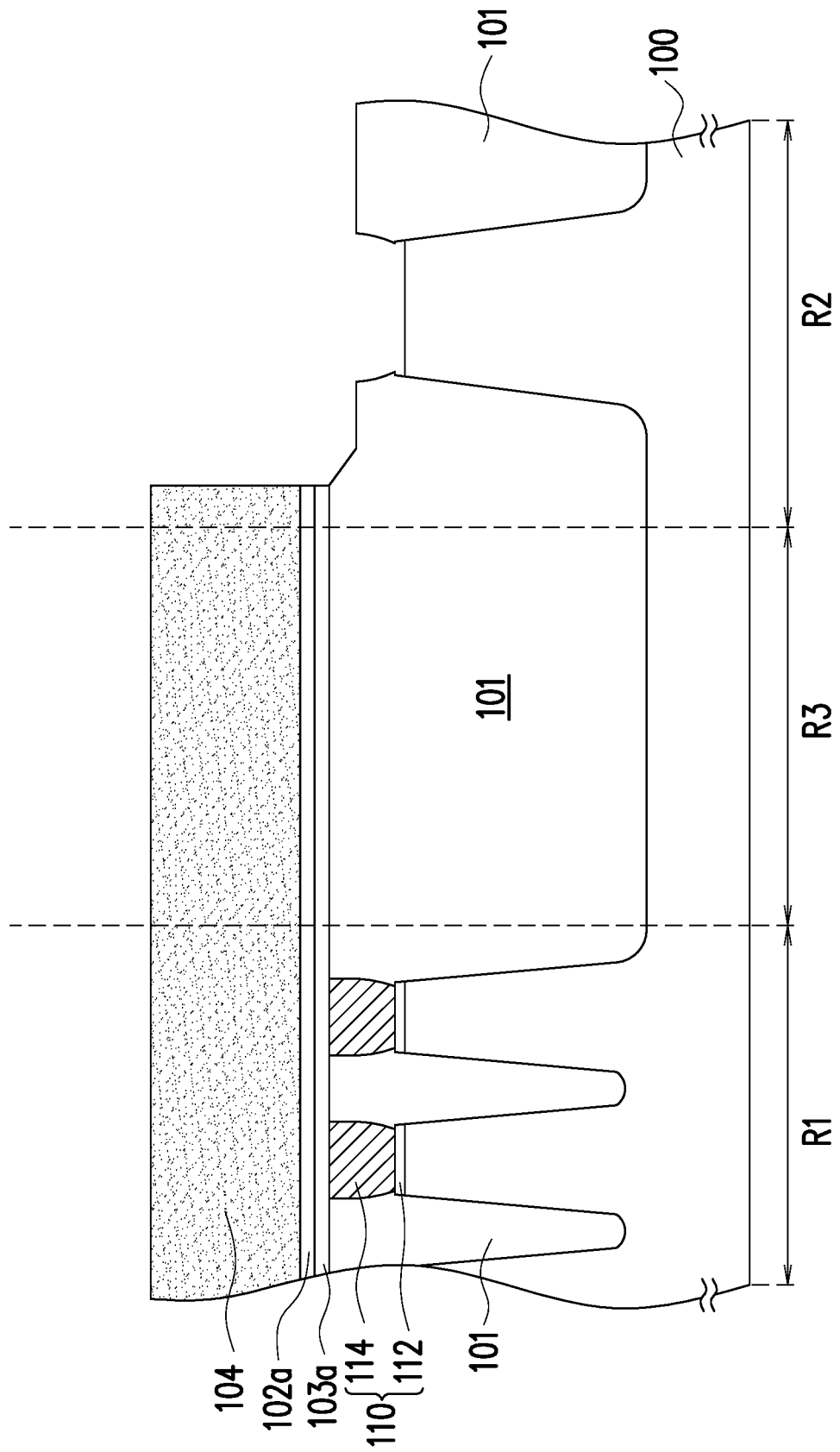

The semiconductor memory device illustrated in the following paragraphs is an example of a flash memory. However, the invention is not limited thereto.

Referring to FIG. 1A, the present embodiment provides a method of manufacturing a semiconductor memory device including following steps. First, a substrate 100 is provided, and the substitute 100 may be a silicon substrate, for example. Specifically, the substrate 100 includes an array region R1, a peripheral region R2, and a boundary region R3 between the array region R1 and the peripheral region R2. In an embodiment, the array region R1 may have a plurality of memory cells therein; the periphery region R2 may have a plurality of logic circuits (e.g., transistors) therein. In other embodiments, the peripheral region R2 may also have a memory therein.

A first stack structure 110 is then formed on the substrate 100 in the array region R1 and a second stack structure 120a is formed on the substrate 100 in the peripheral region R2. The first stack structure 110 includes a first gate dielectric layer 112 and a first conductive layer 114. The second stack structure 120a includes a second gate dielectric layer 122a and a second conductive layer 124a.

In the embodiment, the first gate dielectric layer 112 may be a tunneling dielectric layer, for example. The first gate dielectric layer 112 includes silicon oxide, silicon oxynitride, silicon nitride or other suitable dielectric materials, which may be formed by chemical vapor deposition (CVD), furnace tube oxidation, or the like, and may have a thickness of 2 nm to 20 nm. In the embodiment, the first conductive layer 114 may be a floating gate, for example. The first conductive layer 114 includes doped polysilicon, undoped polysilicon, or a combination thereof, which may be formed by CVD, and may have a thickness of 10 nm to 150 nm.

In an embodiment, the second gate dielectric layer 122a may be formed simultaneously with the first gate dielectric layer 112, and the second conductive layer 124a may be formed simultaneously with the first conductive layer 114. However, the invention is not limited thereto. In alternate embodiments, the second gate dielectric layer 122a and the first gate dielectric layer 112 may have a same material or different materials. The second conductive layer 124a and the first conductive layer 114 may have a same material or different materials.

Thereafter, a plurality of isolation structures 101 are formed in the substrate 100. Specifically, the isolation structures 101 extend from top surfaces of the first stack structure 110 and the second stack structure 120a toward the substrate 100. As shown in FIG. 1A, one of the isolation structures 101 may be located in the substrate 100 of the boundary region R3 between the array region R1 and the peripheral region R2, so as to separate the first stack structure 110 from the second stack structure 120a. In addition, another of the isolation structures 101 may be located in the substrate 100 of the array region R1, so as to separate adjacent two first stack structures 110. Further, the other of the isolation structures 101 may be located in the substrate 100 of the peripheral region R2, so as to separate adjacent two second stack structures 120a. In an embodiment, the isolation structures 101 include an isolation material, which may be a high density plasma oxide layer or a spin-on glass (SOG), for example. In alternate embodiments, the isolation structures 101 may be shallow trench isolation (STI) structures.

As shown in FIG. 1A, after forming the isolation structures 101, a buffer layer 103 is blanketly formed on the substrate 100, and a protective layer 102 is blanketly formed on the buffer layer 103. In an embodiment, the buffer layer 103 includes an oxide layer, such as silicon oxide, which may be formed by CVD, furnace tube oxidation, or the like, and may have a thickness of 5 nm to 100 nm. The protective layer 102 includes a nitride layer, such as silicon nitride, silicon oxynitride, or a combination thereof, which may be formed by CVD, and may have a thickness of 5 nm to 100 nm.

Referring to FIG. 1A and FIG. 1B, a first mask layer 104 is formed on the protective layer 102. Specifically, as shown in FIG. 1B, the first mask layer 104 extends from the array region R1 across the boundary region R3 to cover a portion of the peripheral region R2. The first mask layer 104 is a photoresist material, for example.

Next, a first etching process is performed to remove a portion of the protective layer 102, a portion of the buffer layer 103, the second conductive layer 124a, and a portion of isolation structures 101 by using the first mask layer 104 as an etching mask. During the first etching process, the second gate dielectric layer 122a may be used as an etching stop layer to prevent the substrate 100 from being damaged. In an embodiment, the first etching process includes a dry etching process, such as a reactive ion etching (RIE) process. After the first etching process, as shown in FIG. 1B, the second gate dielectric layer 122a is further removed to expose the substrate 100 in the peripheral region R2.

Figure 1C:
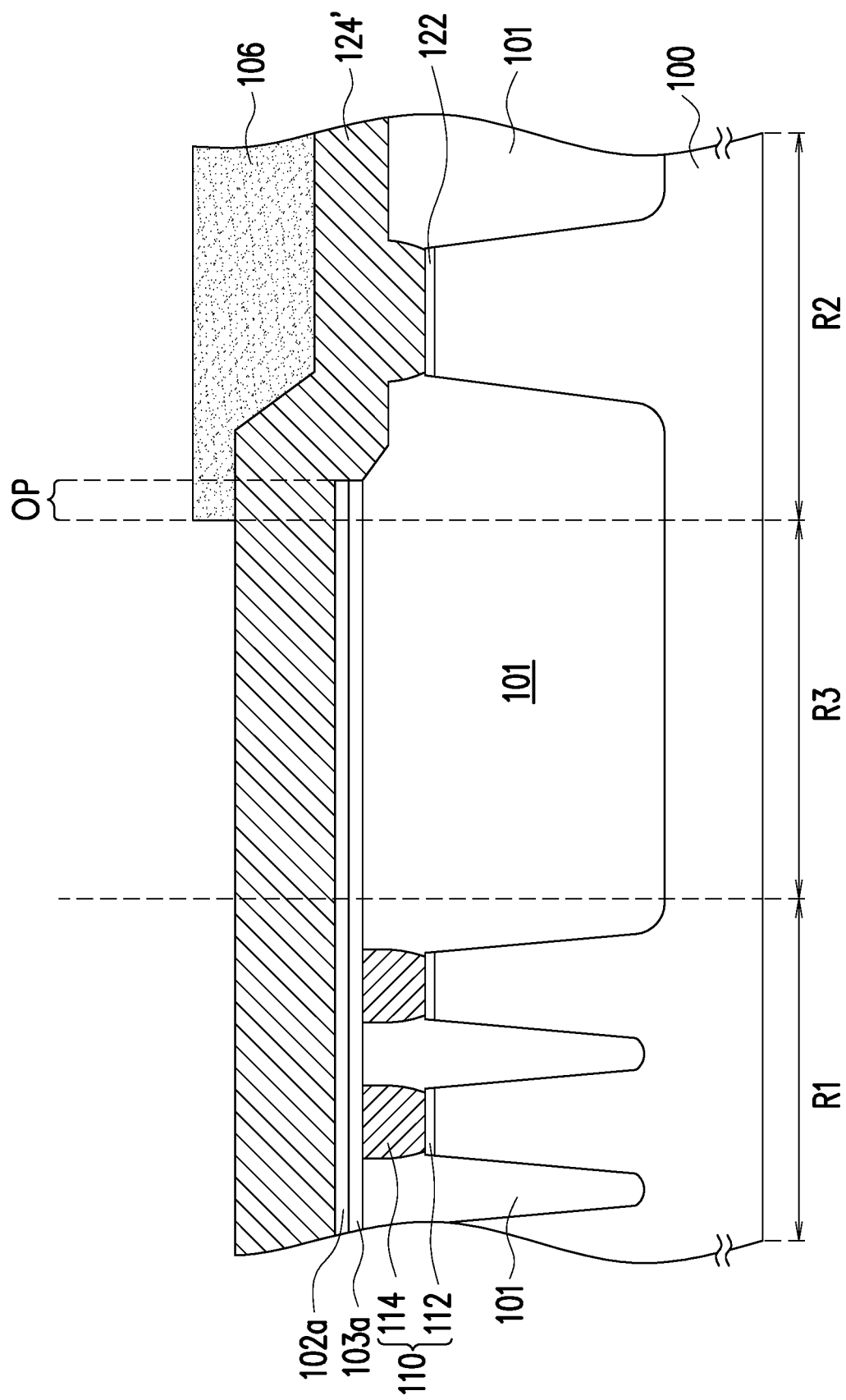

Referring to FIG. 1B and FIG. 1C, after removing the first mask layer 104, a second gate dielectric layer 122 is formed on the substrate 100 in the peripheral region R2. The second gate dielectric layer 122 includes silicon oxide, silicon oxynitride, silicon nitride or other suitable dielectric materials, which may be formed by CVD, furnace tube oxidation, or the like, and may have a thickness of 2 nm to 50 nm. Further, since the semiconductor devices in the array region R1 and in the peripheral region R2 have different operation voltages, the thickness of the second gate dielectric layer 122 may be greater than the thickness of the first gate dielectric layer 112.

A conductive material 124' is then blanketly formed on the substrate 100. As shown in FIG. 1C, the conductive material 124' covers the protective layer 102a, the buffer layer 103a, the isolation structures 101, and the second gate dielectric layer 122. In an embodiment, the conductive material 124' includes doped polysilicon, undoped polysilicon, or a combination thereof, which may be formed by CVD, and may have a thickness of 50 nm to 300 nm. Thereafter, a second mask layer 106 is formed on the conductive material 124' in the peripheral region R2. In an embodiment, the second mask layer 106 may be a photoresist material.

Figure 1D:
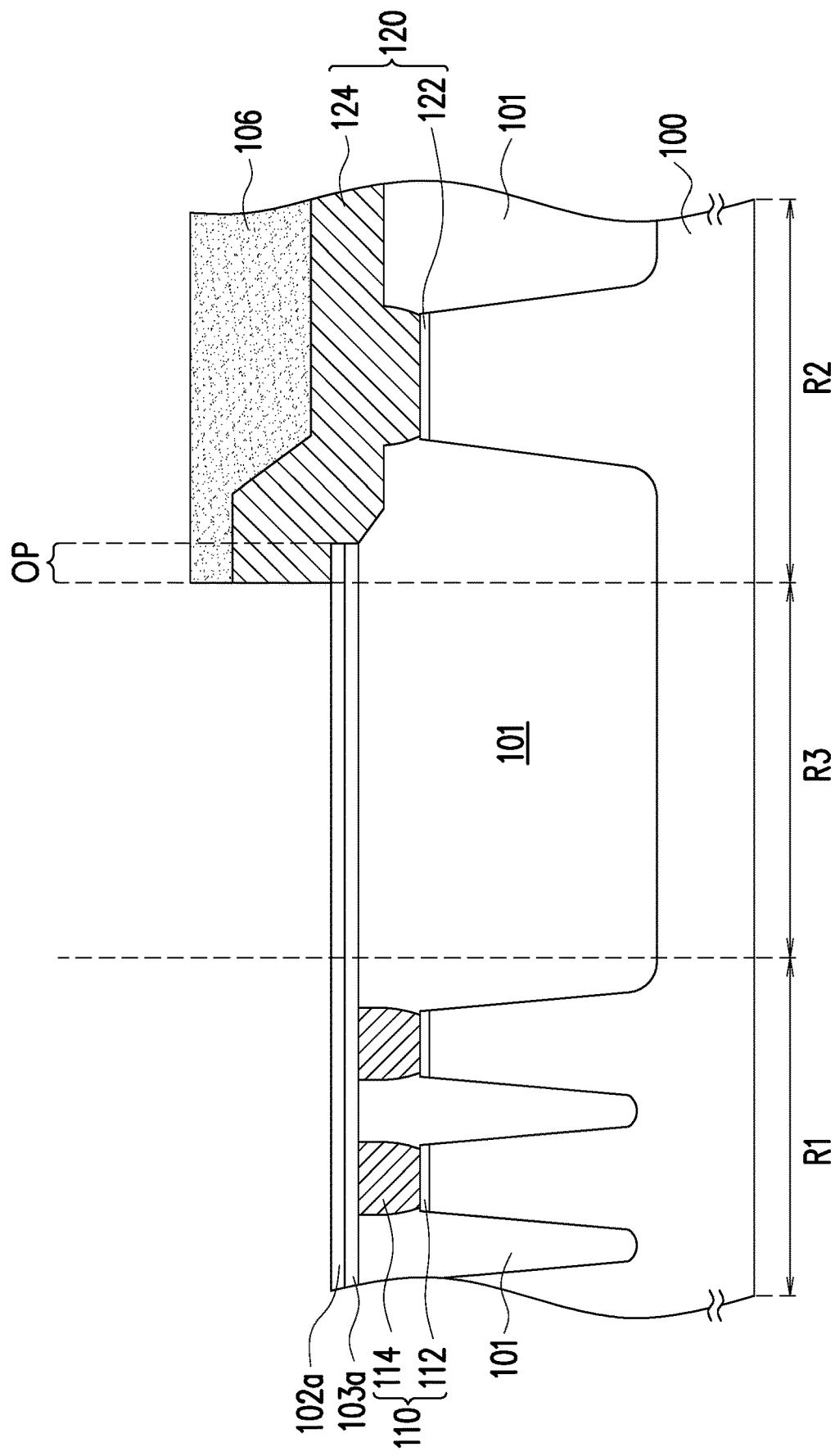

Referring to FIG. 1C and FIG. 1D, a second etching process is performed to remove a portion of the conductive material 124' by using the second mask layer 106 as an etching mask, thereby forming a second conductive layer 124. During the second etching process, the protective layer 102a may be used as an etching stop layer. In the case, as shown in FIG. 1D, the protective layer 102a is exposed by the second conductive layer 124. In an embodiment, the second etching process includes a dry etching process, such as RIE.

Figure 1E:
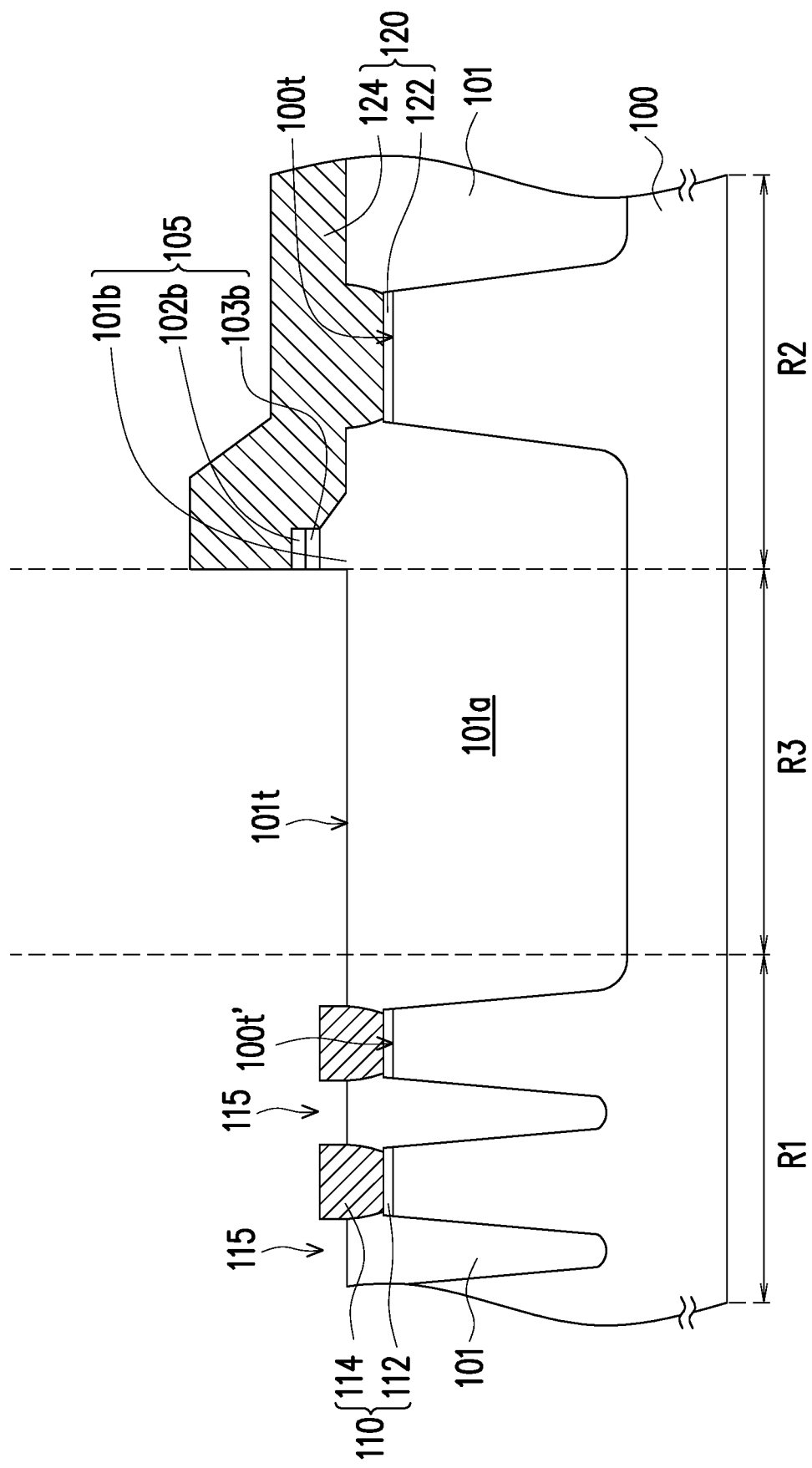

Referring to FIG. 1D and FIG. 1E, after removing the second mask layer 106, a wet etching process is performed to remove a portion of the protective layer 102a and the buffer layer 103a therebelow, and portions of the isolation structures 101 by using the second conductive layer 124 as an etching mask, so as to expose the first stack structure 101. In the case, as shown in FIG. 1E, the first stack structure 110 protrudes from top surface 101t of the isolation structures 101, so as to form a recess 115 between adjacent two first stack structures 110. The recess 115 exposes a portion of a sidewall of the first conductive layer 114, which may increase a coupling area between the first conductive layer 114 and a to-be-formed third conductive layer 134 (shown in FIG. 1F), thereby enhancing the gate coupling ratio (GCR). In an embodiment, the wet etching process may include a plurality of etching steps. For example, a first etching step may be performed to remove the protective layer 102a made of nitride, and a second etching step is then performed to remove the buffer layer 103a made of the oxide and the isolation structures 101 therebelow. In alternate embodiments, the first etching step may include using an etchant containing phosphoric acid to remove the nitride, for example; and the second etching step may include using buffered hydrofluoric acid (BHF) to remove oxides, for example. However, the invention is not limited thereto.

It should be noted that, the first mask layer 104 (shown in FIG. 1B) and the second mask layer 106 (shown in FIG. 1C) are partially overlapped at an overlap region OP (as shown in FIG. 1D). In an embodiment, the overlap region OP may be in a range between 0.3 μm and 1.0 μm. After performing the wet etching process, the protective layer 102b is formed in the overlap region OP defined by the first mask layer 104 and the second mask layer 106, as shown in FIG. 1E. In addition, the protective layer 102b is formed between the second conductive layer 124 and the isolation structure 101 (or the buffer layer 103b) from a view of a perpendicular direction. That is, the second conductive layer 124 is disposed on the second gate dielectric layer 122 and extends to cover the protective layer 102b on the isolation structure 101. The protective layer 102b may avoid the isolation structure 101 therebelow from being excessive consumed during the wet etching process, so as to further protect a bottom surface of the overlying second conductive layer 124, thereby reducing the generation of polysilicon residue defects. In some embodiments, an un-etched isolation structure below the protective layer 102b may be referred to as another protective layer 101b. Hereinafter, the isolation structure above the top surface 101t of the isolation structure 101 is referred to as a protective layer 101b, and the rest is referred to as an isolation structure 101a. As shown in FIG. 1E, the protective layer 101b, the protective layer 102b, and the buffer layer 103b therebetween may constitute a protective structure 105. The protective structure 105 may protect the bottom surface of the second conductive layer 124 thereon, so as to reduce the generation of polysilicon residue defects. In other words, the protective structure 105 of the embodiment is able to improve the reliability and yield of the semiconductor memory device effectively.

In addition, the first mask layer 104 (shown in FIG. 1B) extends from the array region R1 across the boundary region R3 to cover a portion of the periphery region R2. Therefore, the isolation structure 101 in the boundary region R3 is substantially protected by the protective layer 102a. That is, the isolation structure 101 in the boundary region R3 only undergoes the second etching process without undergoing the first etching process. Accordingly, the isolation structure 101 in the boundary region R3 is not over-etched. In the case, as shown in FIG. 1E, the top surface 101t of the isolation structure 101 in the boundary region R3 is substantially planar or flat, which benefits of the deposition of to-be-formed layers. Further, the top surface 101t of the isolation structure 101 in the boundary region R3 is higher than the top surface 100t of the substrate 100 in the peripheral region R2 (or a forming surface of the second gate dielectric layer 122), and is higher than the top surface 100t' of the substrate 100 in the array region R1 (or a forming surface of the first gate dielectric layer 112).

Figure 1F:
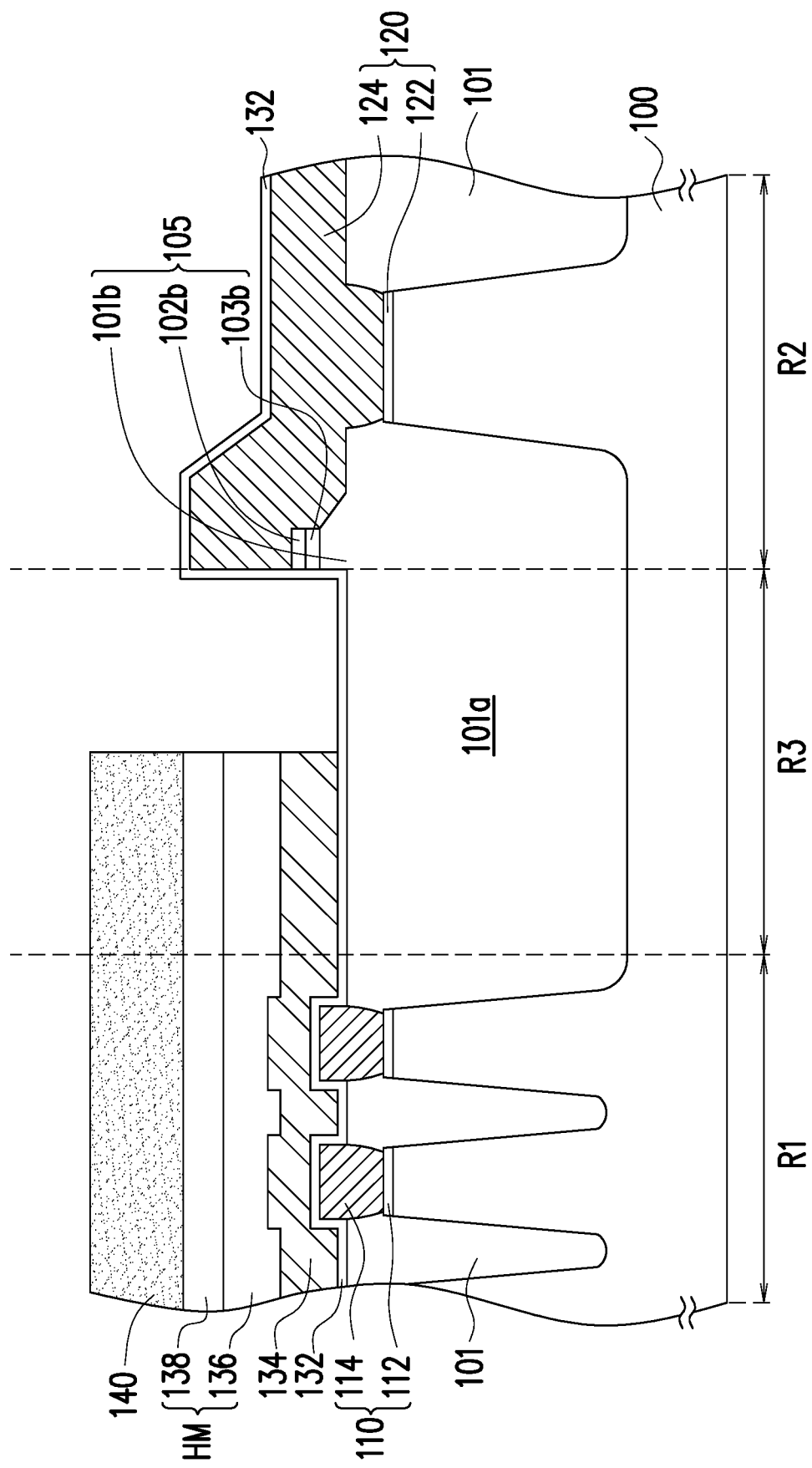

Referring to FIG. 1E and FIG. 1F, a dielectric layer 132 and a third conductive layer 134 are sequentially formed on the substrate 100. The dielectric layer 132 conformally covers the first stack structure 110, the isolation structures 101, and the second stack structure 120. The dielectric layer 132 may be a composite layer structure composed of silicon oxide-silicon nitride-silicon oxide (ONO), for example. However, the invention is not limited thereto. The third conductive layer 134 includes doped polysilicon, undoped polysilicon, or a combination thereof. The third conductive layer 134 may be a control gate; and the dielectric layer 132 may be an interlayer dielectric layer between the first conductive layer 114 (i.e., the floating gate) and a third conductive layer 134 (i.e., the control gate).

In an embodiment, the third conductive layer 134 may be formed by following steps: blanketly forming a third conductive material; sequentially forming a carbon material, a nitride material, and a photoresist pattern 140 on the third conductive material; removing a portion of the carbon material and a portion of the nitride material by using the photoresist pattern 140 as an etching mask to form a hard mask layer HM composed of a carbon layer 136 and a nitride layer 138; and a portion of the third conductive material is removed by using the hard mask layer HM as an etching mask to expose the dielectric layer 132. In the case, as shown in FIG. 1F, the third conductive layer 134 covers the array region R1 and a portion of the boundary region R3, while the third conductive layer 134 does not cover the peripheral region R2.

In summary, in the present invention, the first mask layer and the second mask layer are partially overlapped, so as to form a protective structure between the second conductive layer and the isolation structure. The protective structure is able to prevent the underlying isolation structure from being excessively consumed during the etching process, so as to reduce the generation of polysilicon residue defects, thereby improving the reliability and yield of the semiconductor memory device. In addition, the top surface of the isolation structure in the boundary region is substantially planar or flat, which may facilitate the deposition of subsequently formed layers, thereby increasing the process window and yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor memory device, comprising:
   a substrate, having an array region and a periphery region;
   an isolation structure, disposed in the substrate between the array region and the periphery region;
   a gate dielectric layer, disposed on the substrate in the periphery region;
   a conductive layer, disposed on the gate dielectric layer, wherein the conductive layer extends to cover a portion of a top surface of the isolation structure; and
   a protective structure, disposed between the conductive layer and the isolation structure, wherein the protective structure has a sidewall substantially aligned with a sidewall of the conductive layer.

2. The semiconductor memory device as recited in claim 1, wherein the protective structure comprises a composite layer structure having different dielectric materials.

3. The semiconductor memory device as recited in claim 1, wherein the top surface of the isolation structure is higher than a top surface of the substrate in the periphery region.

4. The semiconductor memory device as recited in claim 1, wherein the substrate further comprises a boundary region disposed between the array region and the periphery region, and the top surface of the isolation structure in the boundary region is substantially flat.

5. The semiconductor memory device as recited in claim 1, further comprising:
   a tunneling dielectric layer, disposed on the substrate in the array region; and
   a floating gate, disposed on the tunneling dielectric layer, wherein a thickness of the tunneling dielectric layer is less than a thickness of the gate dielectric layer.

6. The semiconductor memory device as recited in claim 1, wherein the isolation structure further extends into the substrate of the periphery region, and the conductive layer is in direct contact with a portion of the isolation structure in the periphery region.

* * * * *